(12) United States Patent
Meade (10) Patent No.: US 8,669,629 B2
(45) Date of Patent: Mar. 11, 2014

(54) PHOTONIC SYSTEMS AND METHODS OF FORMING PHOTONIC SYSTEMS

(71) Applicant: Micron Technology, Inc., Boise, ID (US)

(72) Inventor: Roy E. Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/766,970

(22) Filed: Feb. 14, 2013

(65) Prior Publication Data

US 2013/0154042 A1      Jun. 20, 2013

Related U.S. Application Data

(63) Continuation of application No. 13/174,525, filed on Jun. 30, 2011, now Pat. No. 8,399,949.

(51) Int. Cl.
*H01L 31/0232* (2006.01)
*H01L 31/18* (2006.01)

(52) U.S. Cl.
USPC .......................................... 257/432; 438/69

(58) Field of Classification Search
USPC .......... 257/432, 436, 449, 458, 431, E31.061, 257/E31.065, E31.127, E31.004; 438/31, 438/69
See application file for complete search history.

(56) References Cited

U.S. PATENT DOCUMENTS

| 6,943,051 | B2 | 9/2005 | Augusto et al. |
| 7,305,157 | B2 | 12/2007 | Ahn et al. |
| 7,875,522 | B2 | 1/2011 | Kapur et al. |
| 2004/0201100 | A1 | 10/2004 | Lim et al. |
| 2009/0022500 | A1 | 1/2009 | Pinguet et al. |
| 2010/0038736 | A1 | 2/2010 | Assefa et al. |
| 2010/0078680 | A1 | 4/2010 | Cheng et al. |
| 2010/0079222 | A1 | 4/2010 | Makita |
| 2011/0012221 | A1 | 1/2011 | Fujikata et al. |

OTHER PUBLICATIONS

Chen et al., "Integrated GHz silicon photonic interconnect with micrometer-scale modulators and detectors", Optics Express, Aug. 17, 2009, vol. 17(17), pp. 15248-15256.
Michel, et al., "High-performance Ge—on—Si photodetectors", Nature Photonics, vol. 4, Aug. 2010, pp. 527-534.
Park et al., "Defect reduction of selective Ge epitaxy in trenches on Si(001) substrates using aspect ratio trapping", American Institute of Physics, Applied Physics Letters 90, 2007, pp. 052113-1 to 052113-3.
Wikipedia, "Silicon photonics", retrieved May 9, 2011 from http:/en.wikipedia.org/wiki/Silicon_photonics.

*Primary Examiner* — Whitney T Moore
(74) *Attorney, Agent, or Firm* — Wells St. John P.S.

(57) ABSTRACT

Some embodiments include photonic systems. The systems may include a silicon-containing waveguide configured to direct light along a path, and a detector proximate the silicon-containing waveguide. The detector may comprise a detector material which has a lower region and an upper region, with the lower region having a higher concentration of defects than the upper region. The detector material may comprise germanium in some embodiments. Some embodiments include methods of forming photonic systems.

11 Claims, 5 Drawing Sheets

PHOTONIC SYSTEMS AND METHODS OF FORMING PHOTONIC SYSTEMS

RELATED PATENT DATA

This patent resulted from continuation of U.S. patent application Ser. No. 13/174,525, which was filed Jun. 30, 2011, which is now U.S. Pat. No. 8,399,949, and which is hereby incorporated heein by reference.

TECHNICAL FIELD

Photonic systems and methods of forming photonic systems.

BACKGROUND

Photonic systems are being developed for incorporation into integrated circuitry. The photonic systems may be utilized for chip-to-chip communication, for photosensors and/or for numerous other applications. The photonic systems may utilize silicon as an optical medium of a waveguide, and may utilize any suitable wavelengths of radiation; such as, for example, wavelengths within a band centered at about 1.2 micrometers.

It is often desired that photonic systems have integrated detectors in addition to the integrated waveguides, with the detectors being configured to determine if radiation is passing through the waveguides. Germanium may be utilized to fabricate detectors which can be integrated into photonic systems with silicon-based waveguides. Specifically, a diode may be formed to have a depletion zone within germanium, and passage of light across the germanium may be detected by a change in current within such diode.

Difficulties are encountered in attempting to create fabrication sequences suitable for commercial production of integrated photonic systems. Accordingly, it is desired to develop new photonic systems, and new methods of fabrication of photonic systems, suitable for commercial production.

DETAILED DESCRIPTION OF THE ILLUSTRATED EMBODIMENTS

As discussed above in the "background" section, germanium may be utilized to form detectors of integrated photonic systems. Specifically, the detectors may comprise diodes which have depletion regions within germanium. The depletion region of a detector may be located in a portion of the detector that interacts with light, and light may be detected by a change in the current through the diode.

"Dark current" is the reverse bias diode current in the absence of light. There will be a high background dark current if the germanium of the detector has a large number of defects (for instance, vacancies, interstitial defects, dislocations, stacking faults, etc.) in the portion of the depletion region that interacts with light. Thus, a detector having a high number of defects in the germanium of the depletion region can have low signal-to-noise relative to a detector having a low number of defects in such germanium. High signal-to-noise is desired for optimal sensitivity of a detector.

Park et al. (*Defect Reduction of Selective Ge Epitaxy in Trenches on Si(001) Substrates Using Aspect Ratio Trapping*, Applied Physics Letters 90 052113 (2007)) describe an Aspect Ratio Trapping (ART) method for forming germanium-containing structures to have defect-free regions. Specifically, the structures are epitaxially-grown from silicon, with lower regions of the structures being in high aspect ratio openings. Defects are created in the lower regions of the germanium-containing structures due to lattice mismatch between the germanium and the silicon, but such defects are restrained to be only within the lower regions of the germanium-containing structures due to the high aspect ratio openings. Specifically, the defects are trapped within the high aspect ratio openings so that only the germanium which grows within the openings has defects, and the germanium which grows above the high aspect ratio openings is defect free. Some embodiments described herein take advantage of methodology analogous to that described in Park et al. to form detectors suitable for utilization in integrated photonic systems. The detectors may comprise germanium and/or various other materials that lattice mismatch relative to monocrystalline silicon, including, for example, one or more of SiGe, InP, GaAs, AlN, etc.; where the formulas indicate principle components rather than specific stoichiometries.

Example embodiments are described with reference to FIGS. 1-15.

Figure 1:
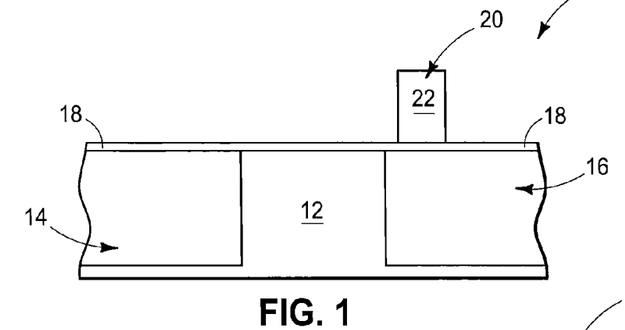
FIGS. 1-6 are diagrammatic cross-sectional views of a portion of a semiconductor construction at various process stages of an example embodiment method of forming a photonic system.

Referring to FIG. 1, a construction 10 is shown at a processing stage associated with fabrication of a photonic system. The construction comprises a base 12 having electrically insulative regions 14 and 16 extending therein.

Base 12 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 12 is shown to be homogenous, the base may comprise numerous materials in some embodiments. For instance, base 12 may correspond to a semiconductor substrate containing one or more materials associated with integrated circuit fabrication. In such embodiments, such materials may correspond to one or more of refractory metal materials, barrier materials, diffusion materials, insulator materials, etc.

The insulative regions 14 and 16 may correspond to so-called shallow trench isolation (STI) and may comprise any suitable electrically insulative compositions or combinations of compositions. For instance, the insulative regions 14 and 16 may comprise, consist essentially of, or consist of one or both of silicon nitride and silicon dioxide.

Dielectric material 18 extends over base 12, and across the insulative regions 14 and 16. Dielectric material 18 may comprise any suitable composition or combination of compositions, and in some embodiments may comprise, consist essentially of, or consist of one or both of silicon dioxide and silicon nitride.

In some embodiments, various of the illustrated structures of construction 10 are formed during fabrication of integrated circuitry at other locations (not shown) of the construction. Such may enable integration of photonic systems with only minor changes to existing fabrication processes, which can enable reasonably straightforward incorporation of the photonic systems into existing commercial fabrication processes. In some embodiments, the dielectric material 18 may correspond to, for example, the gate dielectric utilized in other regions of construction 10 (not shown) during fabrication of transistors.

A silicon-containing waveguide 20 is over dielectric material 18, and in the shown embodiment is directly over the insulative region 16. Thus, the waveguide 20 is supported by base 12, and is spaced from base 12 by the insulative material of dielectric 18 and the insulative material of region 16.

The waveguide 20 comprises silicon-containing material 22. Such silicon-containing material may comprise, consist essentially of, or consist of silicon. The silicon-containing material of the waveguide preferably has very little dopant therein, and may consist of silicon having only an intrinsic dopant level of less than or equal to $1 \times 10^{17}$ atoms/cm$^3$. In some embodiments, the waveguide may extend from a line utilized for other applications in other regions (not shown) of construction 10, and thus the waveguide may be simultaneously fabricated during fabrication of a structure utilized in another region of the construction. For instance, the waveguide may extend from a line of polycrystalline silicon which is utilized in transistor devices (for instance, CMOS devices), electrical interconnects, etc., in other regions of construction 10.

Figure 2:
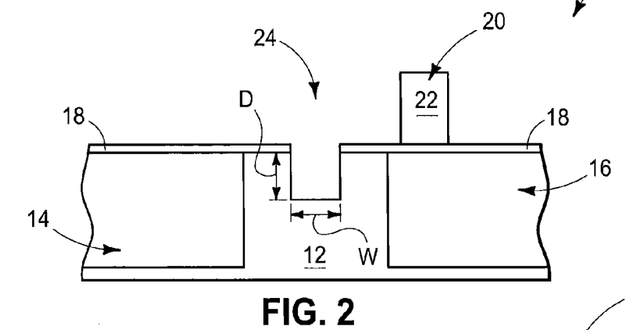

Referring to FIG. 2, an opening 24 is etched through material 18 and into the semiconductor material of base 12. In some embodiments, dielectric material 18 may be omitted from the illustrated region of construction 10 where the photonic system will be formed. In such embodiments, the opening may be formed directly into the semiconductor material of base 12 rather than being formed through material 18.

Opening 24 may be formed with any suitable processing. For instance, a patterned mask (not shown) may be photolithographically formed over construction 10 to define a location for opening 24, then opening 24 may be etched into semiconductor material of base 12, and subsequently the mask may be removed to leave the shown construction of FIG. 2.

Opening 24 may be formed to any suitable dimensions. The opening is ultimately utilized for ART applications analogous to those described in Park et al., and may be at least as deep as it is wide. In some embodiments, opening 24 may have a depth "D" of less than or equal to about 400 nanometers (nm) and a maximum width "W" along the cross-section of FIG. 2 that is also less than or equal to about 400 nm. In some embodiments, the depth may be less than or equal to about 50 nm, and the width may also be less than or equal to about 50 nm.

Figure 3:
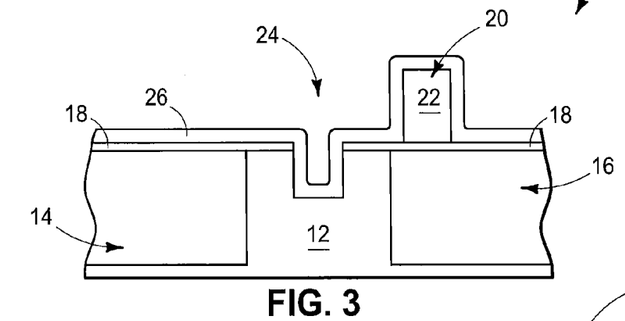

Referring to FIG. 3, a liner material 26 is formed across construction 10 and within opening 24. The liner material narrows the opening. In the shown embodiment, the liner material extends along an outer periphery of waveguide 20 (specifically, over the top of the waveguide and along sidewalls of such waveguide). In other embodiments, the liner material may be formed only within opening 24, and not along the outer periphery of the waveguide.

The liner material 26 may comprise any suitable composition or combination of compositions. Ultimately, the liner material will be utilized to preclude epitaxial growth from along sidewalls of opening 24, and thus the liner may comprise any material suitable for such preclusion of epitaxial growth. In some embodiments, the liner material may comprise one or more electrically insulative compositions; and may, for example, comprise, consist essentially of, or consist of silicon dioxide. In some embodiments, the liner material may comprise, consist essentially of, or consist of electrically conductive material; such as, for example, metals and/or metal-containing compositions. If the liner material comprises metal, it can be preferred that the liner material not be along surfaces of the waveguide 20 in that metal may interfere with passage of light along the waveguide.

The liner material 26 may be formed with any suitable methodology including, for example, one or both of atomic layer deposition (ALD) and chemical vapor deposition (CVD).

Figure 4:
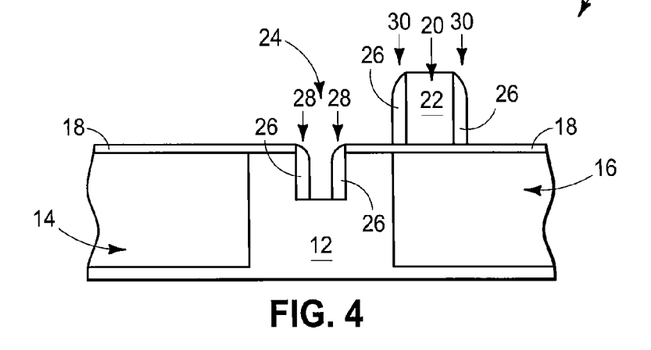

Referring to FIG. 4, the liner material 26 is anisotropically etched to remove the liner material from along a bottom of opening 24 while forming liners 28 along sidewalls of the opening. In the shown embodiment, the anisotropic etch also removes the liner material from over the top of waveguide 20, while leaving sidewall liners 30 of the liner material along sidewalls of the waveguide.

Figure 5:
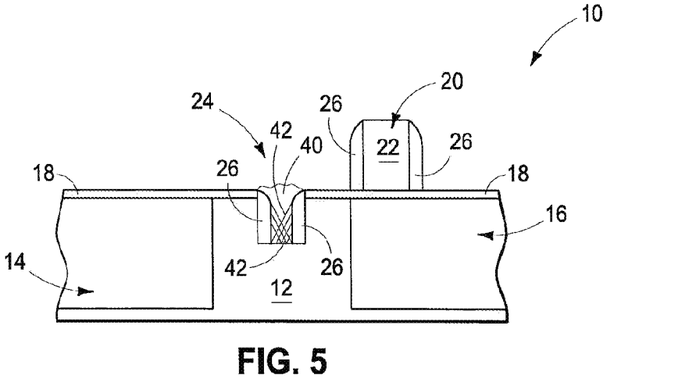

Referring to FIG. 5, detector material 40 is epitaxially grown from the semiconductor material of base 12 exposed at the bottom of opening 24. The detector material may comprise any suitable composition, including, for example, one or more of Ge, SiGe, InP, GaAs and AlN; where the formulas indicate principle components rather than specific stoichiometries. In some embodiments, the detector material 40 may comprise, consist essentially of, or consist of germanium, and the semiconductor material of base 12 may comprise, consist essentially of, or consist of silicon.

The liner material 26 precludes detector material 40 from epitaxially growing from the sidewalls of opening 24, and thus the epitaxial growth is entirely upwardly from the bottom of opening 24. Defects 42 (only some of which are labeled) form within detector material 40 due to lattice mismatch between material 40 and the underlying semiconductor material of base 12. However, the tight aspect ratio of opening 24 traps the defects within opening 24 so that a portion of the detector material above the opening has fewer defects than the portion of the detector material within the opening; and in some embodiments the portion of the detector material above the opening may be defect-free.

Figure 6:
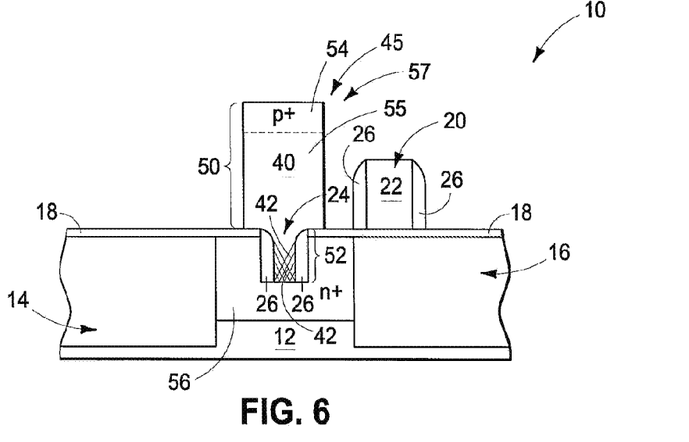

FIG. 6 shows construction 10 after further growth of detector material 40 to increase the amount of detector material above the opening 24. The detector material 40 of FIG. 6 is incorporated into a detector 45. The material 40 of such detector may be considered to comprise an upper region 50 and a lower region 52, with the lower region having a higher concentration of the lattice mismatch-induced defects 42 than the upper region (and in some embodiments, the upper region may have no lattice mismatch-induced defects). In some embodiments, the detector material 40 may be patterned after growth of such material to form the material into a desired shape and size for the detector 45. In such embodiments, a patterned mask (not shown) may be formed to define a desired shape of the material 40 within the detector, and then a pattern may be transferred from the mask to the material 40 with one or more suitable etches.

In the shown embodiment, the patterned detector material 40 is taller than the waveguide 20. In other embodiments the patterned detector material may be a same height as the waveguide 20, or may be shorter than such waveguide.

In embodiments in which the detector material comprises germanium, the growth of the detector material may comprise two stages. The first stage may be to grow a first portion of the detector material within the opening at a relatively low temperature (for instance, a temperature of the epitaxially growing germanium-containing material may be maintained at less than or equal to about 350° C. during the growth of the first portion; such as, for example, within a range of from about 320° C. to about 350° C.), and to then grow a second portion of the detector material at a relatively high temperature (for instance, a temperature of the epitaxially growing germanium-containing material may be maintained at greater than or equal to about 600° C. during the growth of the second portion). The lower temperature is utilized so that the germanium-containing material grows only from the bottom of the opening and not from the lined sidewalls. The higher temperature may enable more rapid growth of the germanium-containing material, but may enhance propagation of defects, and thus it may be advantageous to utilize such higher temperature only after the germanium-containing material has grown beyond the defect-containing region.

A first doped region 54 is formed within detector material 40 and along a top of the detector 45, and a second doped region 56 is formed within semiconductor material of base 12 and directly against the detector material 40 on an opposing side of the detector material from the doped region 54. The first and second doped regions may be formed by any suitable method or methods. For instance, the first and second doped regions may be formed implanting suitable dopants into detector material 40 and base 12. As another example, doped region 54 may be formed by providing dopant in situ during epitaxial growth of detector material 40. As yet another example, doped region 56 may extend into a lower region of material 40; and the part of doped region 56 within material 40 may be formed in situ during epitaxial growth of the lower region of material 40. If the lower part of material 40 is in situ doped, at least some of the region 56 within base 12 may be formed by out-diffusion from the doped lower part of material 40.

The first and second doped regions are of opposite conductivity type to one another, and in the shown embodiment the first doped region 54 is p-type and the second doped region 56 is n-type. The detector material 40 comprises a region 55 between doped regions 54 and 56, and such region 55 may have very little, if any, dopant (i.e., may be intrinsically doped). The three regions 54, 55 and 56 together form a PIN diode 57 (with a PIN diode being a diode having a substantially intrinsic region between a p-type region and an n-type region). A depletion region of such diode may extend within the relatively defect-free upper region 50 of the detector material 40. Although the shown diode 57 is a PIN diode, in other embodiments the diode may be a PN diode. However, it is desired to have a wide a depletion region, and such may be more easily achievable with a PIN diode than with a PN diode.

In the shown embodiment, regions 54 and 56 are p-type doped and n-type doped, respectively. In other embodiments, region 54 may be n-type doped and region 56 may be p-type doped.

In the shown embodiment, defects 42 may act as trap states in the forbidden gap. The occupancy within defects 42 (i.e., whether or not the defects have trapped an electron, and hence whether they function as donors or as "neutralized") may depend on the local Fermi level, which in turn may depend on the bias conditions and doping levels within material 40. The region of material 40 containing the defects 42 may be referred to as a "trappy" region, in that it contains traps contributed through the defects 42.

The doped region 56 is formed after material 40 in the shown embodiment. In other embodiments, at least some of the doped region 56 may be formed before the material 40. In some embodiments, material 40 may be epitaxially grown with the two-stage process described above, and the lower part of material 40 may be in situ doped during the initial epitaxial growth stage so that such lower part of material 40 is of the appropriate conductivity type to be an extension of region 56. A benefit of doing this may be to create a doped region 56 that extends across the interface of base 12 and into the detector material 40. This may improve "hook-up" across such the interface during operation of the diode 57.

Figure 7:
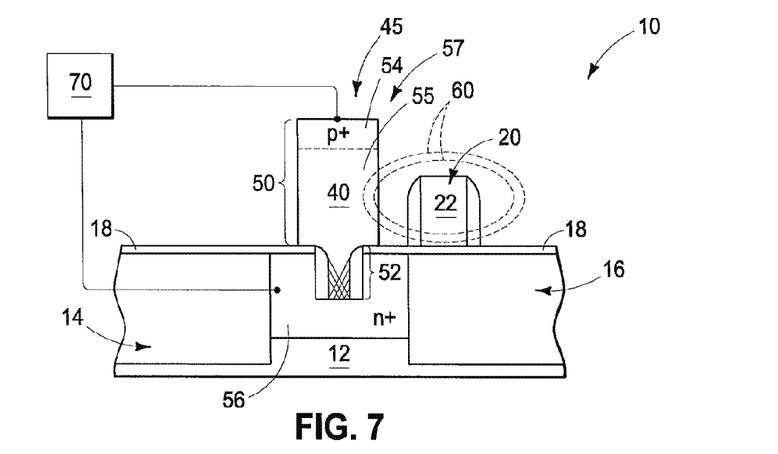
FIG. 7 is a diagrammatic cross-sectional view of the semiconductor construction of FIG. 6 illustrating an operational mode of the example embodiment photonic system.

FIG. 7 shows an operational mode of a photonic system comprising detector 45 in combination with waveguide 20. Specifically, as light 60 (represented by dashed lines) is directed along the length of waveguide 20 (i.e., along a direction in and out of the page relative to the cross-section of FIG. 7), some of the light extends beyond the waveguide. The detector 45 is in close enough proximity to the waveguide so that the light extending beyond the waveguide may couple with the upper region 50 of the detector material. Such can increase the current across the diode 57. Circuitry 70 is connected with the source/drain regions 54 and 56. Such circuitry may be utilized to ascertain the current across the diode 57, and to thereby ascertain whether or not light is flowing along the waveguide 20.

Detector 45 may be within suitable proximity of waveguide 20 for coupling of the depletion region within the detector material 40 to light from the waveguide. In some embodiments, the detector material may be within a distance of less or equal to about 200 nanometers of the waveguide, and in some embodiments the detector material may even touch the waveguide.

An advantage of having the patterned detector material 40 be taller than the waveguide in the embodiment of FIG. 7 is that such may enable the doped region 54 of the detector to be above the light coupling with the detector, which may improve signal-to-noise relative to detectors in which dopant within doped region 54 directly interacts with the coupled light.

The embodiment of FIGS. 1-7 forms detector material 40 after formation of waveguide 20. In other embodiments, the waveguide may be formed after forming the material 40. FIGS. 8-15 show an example of such other embodiments.

Figure 8:
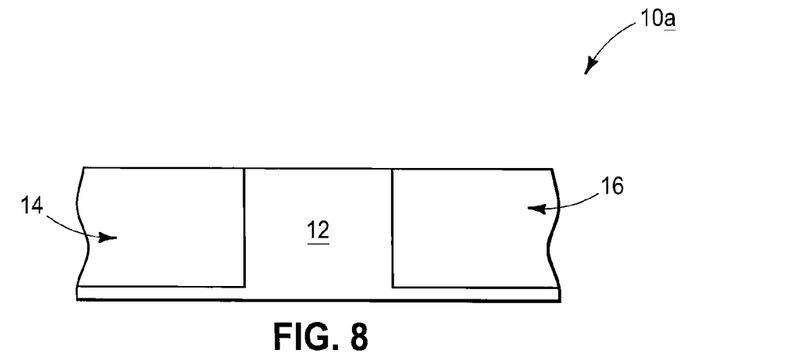
FIGS. 8-15 are diagrammatic cross-sectional views of a portion of a semiconductor construction at various process stages of another example embodiment method of forming a photonic system.

Referring to FIG. 8, a construction 10a is shown to comprise semiconductor base 12 and the electrically insulative regions 14 and 16 extending into such base.

Figure 9:
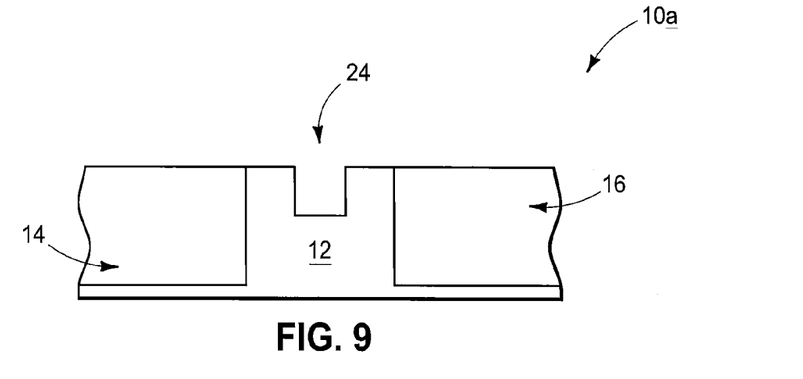

Referring to FIG. 9, opening 24 is extended into base 12.

Figure 10:
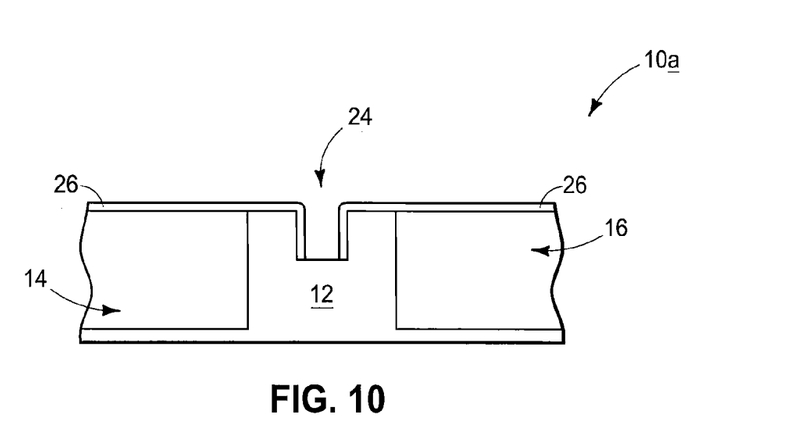

Referring to FIG. 10, liner material 26 is formed within the opening and patterned so that the liner material is only along the sidewalls of opening 24 and not along a bottom of the opening. Such patterning may be accomplished utilizing any suitable methodology. In some embodiments, the patterning may be accomplished by providing a patterned mask (not shown) over liner material 26, transferring a pattern from the mask into material 26 with one or more suitable etches, and then removing the mask to leave the construction of FIG. 10. The patterned mask may comprise, for example, a photolithographically-patterned photoresist mask. In other embodiments, the patterning may comprise an anisotropic etch which removes material 26 from across an upper surface of construction 10 and from the bottom of the opening, while leaving liners of material 26 (analogous to the liners 28 of FIG. 4) along sidewalls of the opening.

Figure 11:
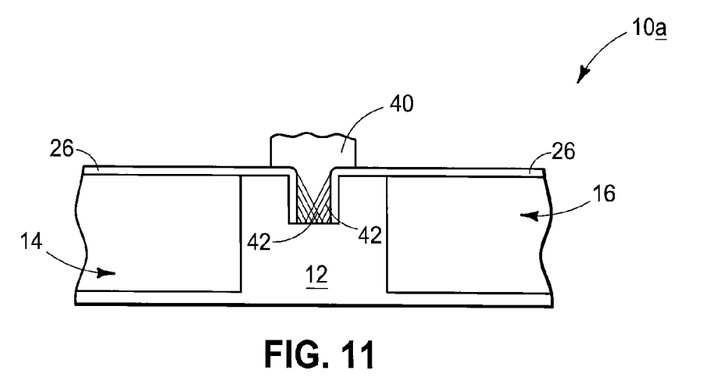
Figure 12:
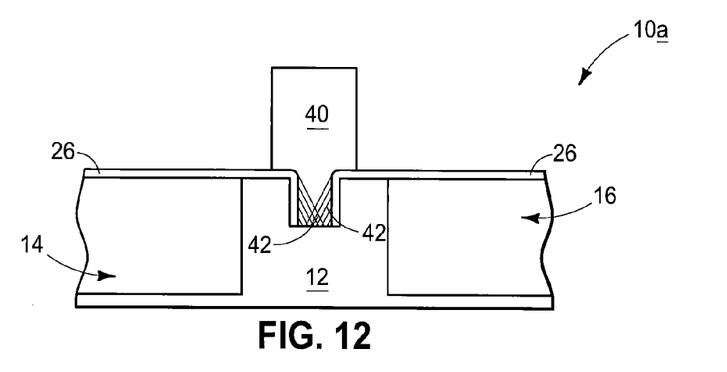

Referring to FIGS. 11 and 12, detector material 40 is epitaxially grown with processing analogous to that discussed above with reference to FIGS. 5 and 6. The detector material is patterned into a suitable configuration for incorporation into a detector.

Figure 13:
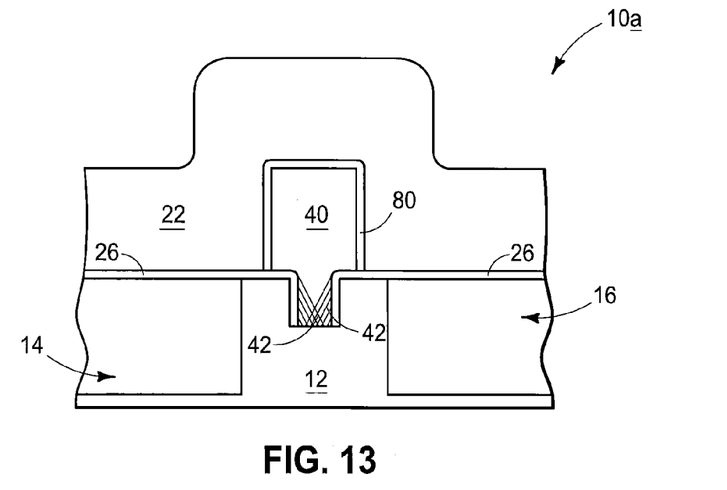

Referring to FIG. 13, a protective material 80 is formed along an outer peripheral surface of detector material 40. In some embodiments, detector material 40 may comprise, consist essentially of, or consist of germanium, and protective material 80 may comprise, consist essentially of, or consist of oxide formed along an outer surface of the germanium. The oxide may be formed by oxidation of the germanium and/or by one or both of ALD and CVD.

Silicon-containing material 22 is formed across an upper surface of construction 10a and over detector material 40. The protective material 80 separates detector material 40 from the silicon-containing material 22. In the shown embodiment, the silicon-containing material is formed directly against an upper surface of liner material 26. In other embodiments, the liner material may be patterned so that it is only under detector material 40, and in such embodiments the silicon-containing material 22 will not be against the liner material.

Figure 14:
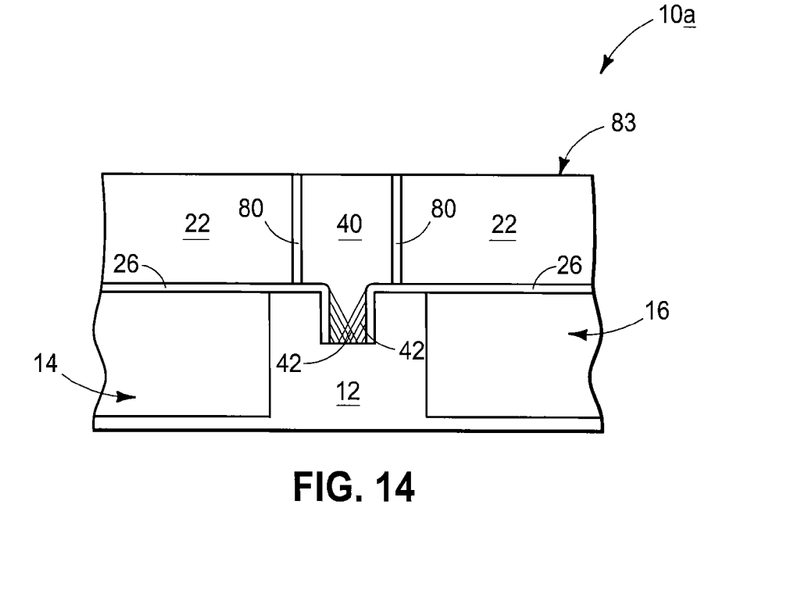

Referring to FIG. 14, chemical-mechanical polishing (CMP) is utilized to form a planarized surface 83 extending across materials 22 and 40. In the shown embodiment, the CMP removes protective material 80 from over an upper surface of material 40.

Figure 15:
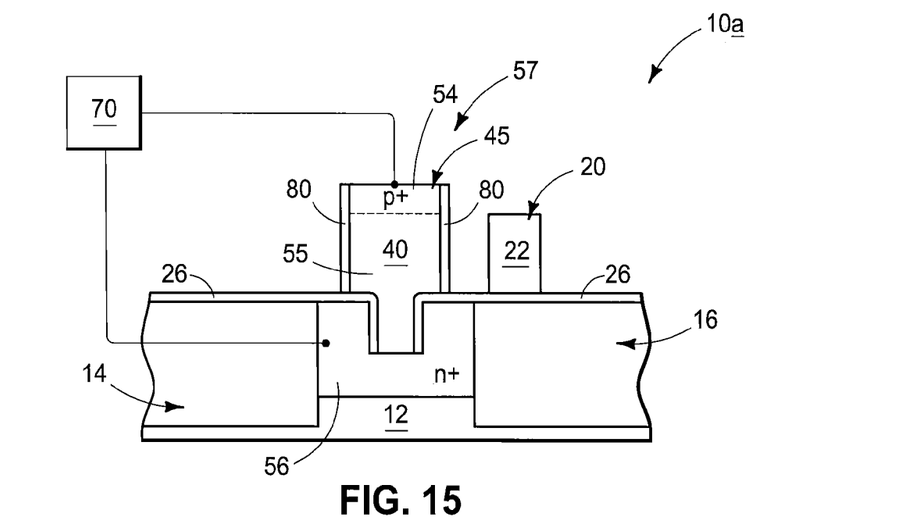

Referring to FIG. 15, silicon-containing material 22 is patterned into a waveguide 20; and detector material 40 is incorporated into a detector 45. The waveguide 20 is over and directly against liner material 26 in the shown embodiment. The waveguide 20 may be against the liner material in embodiments in which the liner material is electrically insulative, such as, for example, in embodiments in which the liner material comprises, consists essentially of or consist of silicon dioxide. If the liner material comprises a metal, it may be preferred that the liner material be patterned prior to forming the waveguide so that the waveguide is not contacting such liner material.

Doped regions 54 and 56 are formed within detector material 40 and base 12, respectively to form the diode 57; and circuitry 70 is electrically with such doped regions. The detector 45 and waveguide 20 may be incorporated into a photonic system analogous to the system discussed above with reference to FIG. 7. In the shown embodiment, the protective material 80 remains along sidewalls of the detector 45. In other embodiments the protective material 80 may be removed, particularly if the protective material 80 would otherwise interfere with light coupling between waveguide 20 and detector 45.

The waveguide 20 is about the same height as the patterned detector material 40 in the embodiment of FIG. 15 due to the waveguide material 22 and detector material 40 having been simultaneously planarized at the processing stage of FIG. 14. In some embodiments it may be desired to utilize further processing to reduce a height of waveguide 20 relative to the patterned detector material 40 so that light passing through the waveguide will not couple with doped region 54 for reasons analogous to those discussed above with reference to FIG. 7.

The electronic devices discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on," "adjacent" or "against" another structure, it can be directly on the other structure or intervening structures may also be present. In contrast, when a structure is referred to as being "directly on," "directly adjacent" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a photonic system. The photonic system comprises a silicon-containing waveguide configured to direct light along a path, and comprises a detector material proximate the silicon-containing waveguide. The detector material is comprised by a detector configured for detecting if light is being directed along the waveguide. A lower region of the detector material has a higher concentration of defects than an upper region of the detector material.

Some embodiments include a photonic system. A silicon-containing waveguide is over a monocrystalline silicon base and configured to direct light along a path. An opening extends into the base, and a liner narrows the opening. A germanium-containing detector material is over the base and extends into the narrowed opening. A lower region of the germanium-containing detector material within the narrowed opening has a higher concentration of defects than an upper region of the germanium-containing detector material above the narrowed opening. The detector material is comprised by a detector configured to detect light within the waveguide.

Some embodiments include a method of forming a photonic system. An opening is etched into a monocrystalline silicon base. Sidewalls of the opening are lined with liner material, and monocrystalline silicon of the base is exposed along a bottom of the lined opening. A detector material is epitaxially grown from the exposed monocrystalline silicon along the bottom of the lined opening. The detector material has a lower region within the lined opening and has an upper region over the lower region. The lower region has a higher concentration of defects than the upper region. A silicon-containing waveguide is formed over the base and proximate the detector material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A photonic system, comprising:
a silicon-containing waveguide over a base;
an opening extending into the base;
a liner narrowing the opening;
germanium-containing detector material over the base and extending into the narrowed opening; the detector material being part of a detector configured to detect light within the waveguide; a lower region of the germanium-containing detector material within the narrowed opening having a higher concentration of defects than an upper region of the germanium-containing detector material above the narrowed opening; and
wherein the upper region extends laterally outwardly beyond the liner so that some of the upper region is directly over the liner.

2. The photonic system of claim 1 wherein the liner comprises electrically insulative material.

3. The photonic system of claim 1 wherein the liner comprises electrically conductive material.

4. A photonic system, comprising:
a silicon-containing waveguide over a monocrystalline silicon base;
an opening extending into the base;
a liner narrowing the opening;
a germanium-containing detector material over the base and extending into the narrowed opening; the detector material being part of a detector configured to detect light within the waveguide; a region of the germanium-containing detector material within the narrowed opening having a higher concentration of defects than a region of the germanium-containing detector material outside of the narrowed opening;
wherein the silicon-containing waveguide is comprised by a line spaced from the monocrystalline silicon base by one or more materials;
wherein the liner comprises a liner material; and
wherein the liner material is along sidewalls of the silicon-containing waveguide line.

5. The photonic system of claim 4 wherein the germanium-containing detector material is taller than the silicon-containing waveguide.

6. The photonic system of claim 4 wherein the germanium-containing detector material is not taller than the silicon-containing waveguide.

7. A method of forming a photonic system, comprising:
forming an opening into a monocrystalline material;
lining sidewalls of the opening with liner material, while leaving monocrystalline material exposed along a bottom of the lined opening;
epitaxially growing a detector material from the exposed monocrystalline material along the bottom of the lined opening; the detector material having a lower region within the lined opening and having an upper region over the lower region; the lower region having a higher concentration of defects than the upper region; the upper region extending laterally outward of the lower region and being across the liner material; and
forming a silicon-containing waveguide over the base and within range of a detector comprising the detector material such that the detector can be utilized to ascertain presence of light within the waveguide.

8. The method of claim 7 wherein the opening has a depth of less than or equal to about 400 nm and a maximum width of less than or equal to about 400 nm.

9. The method of claim 7 wherein the detector material is epitaxially grown germanium, and wherein the epitaxial growth of the germanium comprises:
growing the lower region while maintaining a temperature of the epitaxially growing germanium at less than or equal to about 350° C.; and
growing the upper region while maintaining a temperature of the epitaxially growing germanium at greater than or equal to about 600° C.

10. The method of claim 9 further comprising providing p-type dopant within a top region of the detector material and providing n-type dopant within a region of the base directly adjacent the detector material.

11. The method of claim 9 wherein the silicon-containing waveguide is formed after the detector material.

* * * * *